United States Patent
Lan

(10) Patent No.: US 11,026,346 B2
(45) Date of Patent: Jun. 1, 2021

(54) WATER-REPLENISHING AND GAS-REMOVING STRUCTURE FOR WATER COOLING DEVICE

(71) Applicant: ASIA VITAL COMPONENTS CO., LTD., New Taipei (TW)

(72) Inventor: Wen-Ji Lan, New Taipei (TW)

( * ) Notice: Subject to any disclaimer, the term of this patent is extended or adjusted under 35 U.S.C. 154(b) by 121 days.

(21) Appl. No.: 15/959,296

(22) Filed: Apr. 23, 2018

(65) Prior Publication Data
US 2019/0327856 A1 Oct. 24, 2019

(51) Int. Cl.
| | | |
|---|---|---|
| *H05K 7/20* | (2006.01) | |
| *G06F 1/20* | (2006.01) | |
| *F28D 15/00* | (2006.01) | |
| *F28D 21/00* | (2006.01) | |

(52) U.S. Cl.
CPC ......... *H05K 7/20272* (2013.01); *F28D 15/00* (2013.01); *G06F 1/203* (2013.01); *H05K 7/20281* (2013.01); *F28D 2021/0031* (2013.01); *F28F 2250/08* (2013.01); *G06F 2200/201* (2013.01)

(58) Field of Classification Search
CPC .. H05K 7/20; H05K 7/20263; H05K 7/20272; H05K 7/20281; F28D 15/00; F28D 2015/0291; F28D 2021/0031; F28F 5/00; F28F 2250/00; F28F 2250/08; G06F 1/20; G06F 1/203; G06F 2200/201
USPC .... 165/164, 104.11, 104.19, 104.28, 104.31, 165/120, 121, 122; 251/149.6
See application file for complete search history.

(56) References Cited

U.S. PATENT DOCUMENTS

| | | | |
|---|---|---|---|
| 10,198,046 B2* | 2/2019 | Tsai | G06F 1/20 |
| 10,405,458 B2* | 9/2019 | Fukunaga | F16L 37/40 |
| 2005/0253465 A1* | 11/2005 | Takenaka | H02K 5/20 |
| | | | 310/52 |
| 2008/0053641 A1* | 3/2008 | Lai | H01L 23/4006 |
| | | | 165/120 |
| 2008/0164011 A1 | 7/2008 | Chen | |

(Continued)

FOREIGN PATENT DOCUMENTS

| | | |
|---|---|---|
| CN | 2910576 Y | 6/2007 |
| CN | 201064063 Y | 5/2008 |

(Continued)

*Primary Examiner* — Len Tran
*Assistant Examiner* — Gustavo A Hincapie Serna
(74) *Attorney, Agent, or Firm* — Bradley J. Thorson; DeWitt LLP

(57) ABSTRACT

A water-replenishing and gas-removing structure for water cooling device includes a flow-guiding main body having a water-receiving space as well as an inlet, an outlet, a first opening and a second opening, which are communicable with the water-receiving space. The first and the second valve member are located in the water-receiving space corresponding to the first and the second opening, respectively, for opening or closing them. The first and the second connecting member are connected at an end to the first and the second opening, respectively, and at another end to an external water-replenishing and an external gas-removing apparatus, respectively, via a pipe each. With these arrangements, cooling fluid can be replenished into and surplus gas can be removed from a water cooling device without the need of disassembling or reworking the water cooling device.

9 Claims, 6 Drawing Sheets

(56) References Cited

U.S. PATENT DOCUMENTS

| | | | |
|---|---|---|---|
| 2008/0314559 A1* | 12/2008 | Hsu | F28D 9/0037 |
| | | | 165/80.4 |
| 2012/0024499 A1 | 2/2012 | Chang et al. | |
| 2012/0152498 A1* | 6/2012 | Lyon | H01L 23/473 |
| | | | 165/104.31 |
| 2012/0285663 A1* | 11/2012 | Wu | F28F 13/06 |
| | | | 165/104.26 |
| 2013/0037733 A1* | 2/2013 | Liu | F16L 37/23 |
| | | | 251/149.6 |
| 2013/0051108 A1* | 2/2013 | Nagao | H05K 7/20927 |
| | | | 363/141 |
| 2013/0299139 A1* | 11/2013 | Mounioloux | F28D 1/04 |
| | | | 165/120 |
| 2014/0069614 A1* | 3/2014 | Chiu | F28D 15/00 |
| | | | 165/104.13 |
| 2015/0090915 A1* | 4/2015 | Vranish | F16L 37/413 |
| | | | 251/149.6 |
| 2016/0160813 A1* | 6/2016 | Amaral | F02M 31/14 |
| | | | 123/557 |
| 2016/0309618 A1* | 10/2016 | Tsai | B23P 15/26 |
| 2016/0338223 A1* | 11/2016 | Tsai | G06F 1/20 |
| 2016/0348823 A1* | 12/2016 | Chen | G06F 1/20 |
| 2017/0235350 A1* | 8/2017 | Tsai | H01L 23/473 |
| | | | 165/80.4 |
| 2017/0363362 A1* | 12/2017 | Shen | F28F 3/12 |
| 2018/0067506 A1* | 3/2018 | Hanna | G05D 7/0676 |
| 2018/0269131 A1* | 9/2018 | Na | H01L 23/473 |
| 2019/0174653 A1* | 6/2019 | Fan | H05K 7/20272 |

FOREIGN PATENT DOCUMENTS

| | | |
|---|---|---|
| CN | 202516726 U | 11/2012 |
| CN | 204187069 U | 3/2015 |
| CN | 205789940 U | 12/2016 |
| CN | 106774735 A | 5/2017 |
| CN | 206212522 U | 5/2017 |
| CN | 107436657 Y | 12/2017 |
| CN | 207020624 U | 2/2018 |
| KR | 20020023387 A | 3/2002 |
| TW | M506917 U | 8/2015 |
| TW | M512124 U | 11/2015 |

\* cited by examiner

WATER-REPLENISHING AND GAS-REMOVING STRUCTURE FOR WATER COOLING DEVICE

FIELD OF THE INVENTION

The present invention relates to a water-replenishing and gas-removing structure for water cooling device, and more particularly to a water-replenishing and gas-removing structure that allows cooling fluid to be replenished into and surplus gas to be removed from a water cooling device without the need of disassembling or reworking the water cooling device.

BACKGROUND OF THE INVENTION

Recently, water cooling devices have been widely used to dissipate heat produced by high-power heat sources. Since the water cooling devices provide relatively good heat dissipation efficiency, they are not only used to remove heat from desktop personal computers, but also widely applied to industrial computers, server system chasses, transportation carriers and lighting apparatuses. A water cooling device mainly includes a water block, a pump and a water-cooling radiator; and these units are serially connected to one another via pipes. The water block is mainly used to absorb heat. The water block includes a water-receiving chamber having an open side, which is closed by a heat-exchange interface plate made of a material with good thermal conductivity. An outer side of the heat-exchange interface plate facing away from the water-receiving chamber is in direct contact with a heat source for absorbing heat produced by the heat source. The absorbed heat is then transferred from the outer side to an inner side of the heat-exchange interface plate, and the inner side has a plurality of heat radiating fins provided thereon. A cooling fluid, such as pure water, ethanol or a coolant, is filled in the water-receiving chamber for cooling circulation. By way of heat exchange, the cooling fluid circulates through and cools the heat radiating fins that have absorbed heat, so as to accomplish the cooling operation. The cooling fluid having absorbed heat from the heat radiating fins is driven by a pump to flow from the water head to the water-cooling radiator, at which the heated cooling fluid is cooled. Finally, the cooled cooling fluid flows into the water head again to circulate through the heat radiating fins to cool the latter.

In the process of manufacturing the water cooling device, the cooling fluid tends to leak from the device and air tends to permeate the device, which results in poor working efficiency of the water cooling device. On the other hand, the cooling fluid in the water cooling device will volatilize or leak after the water cooling device has been used for a long period of time, which will also results in poor working efficiency of the water cooling device.

To prevent leakage of cooling fluid at joints of the water cooling device, most of the currently available water cooling devices have joints that are sealed by means of permanent welding, tight-fitting or glue-bonding. Under this circumstance, it will be difficult to handle in the event insufficient cooling fluid or surplus air is found in the water cooling device. It is therefore an important issue as how to overcome the above problem to improve the prior art water cooling devices.

SUMMARY OF THE INVENTION

To overcome the disadvantages of the prior art water cooling devices, a primary object of the present invention is to provide a water-replenishing and gas-removing structure for water cooling device, so that cooling fluid in a water cooling device can be replenished and surplus gas in the water cooling device can be removed without the need of disassembling or reworking the water cooling device.

To achieve the above and other objects, the water-replenishing and gas-removing structure for water cooling device according to the present invention includes a flow-guiding main body, a first valve member, a second valve member, a first connecting member and a second connecting member.

The flow-guiding main body has at least an inlet, an outlet, a water-receiving space, a first opening and a second opening. The inlet, the outlet, the first opening and the second opening are communicable with the water-receiving space. The first valve member is arranged in the water-receiving space corresponding to the first opening for opening or closing the first opening; and the second valve member is arranged in the water-receiving space corresponding to the second opening for opening or closing the second opening. The first connecting member is correspondingly connected to the first opening, and the second connecting member is correspondingly connected to the second opening.

With the water-replenishing and gas-removing structure provided by the present invention, cooling fluid can be replenished into and surplus gas can be removed from a water cooling device without the need of disassembling or reworking the water cooling device, enabling the water cooling device to have largely prolonged service life and largely increased working efficiency.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

Figure 1:
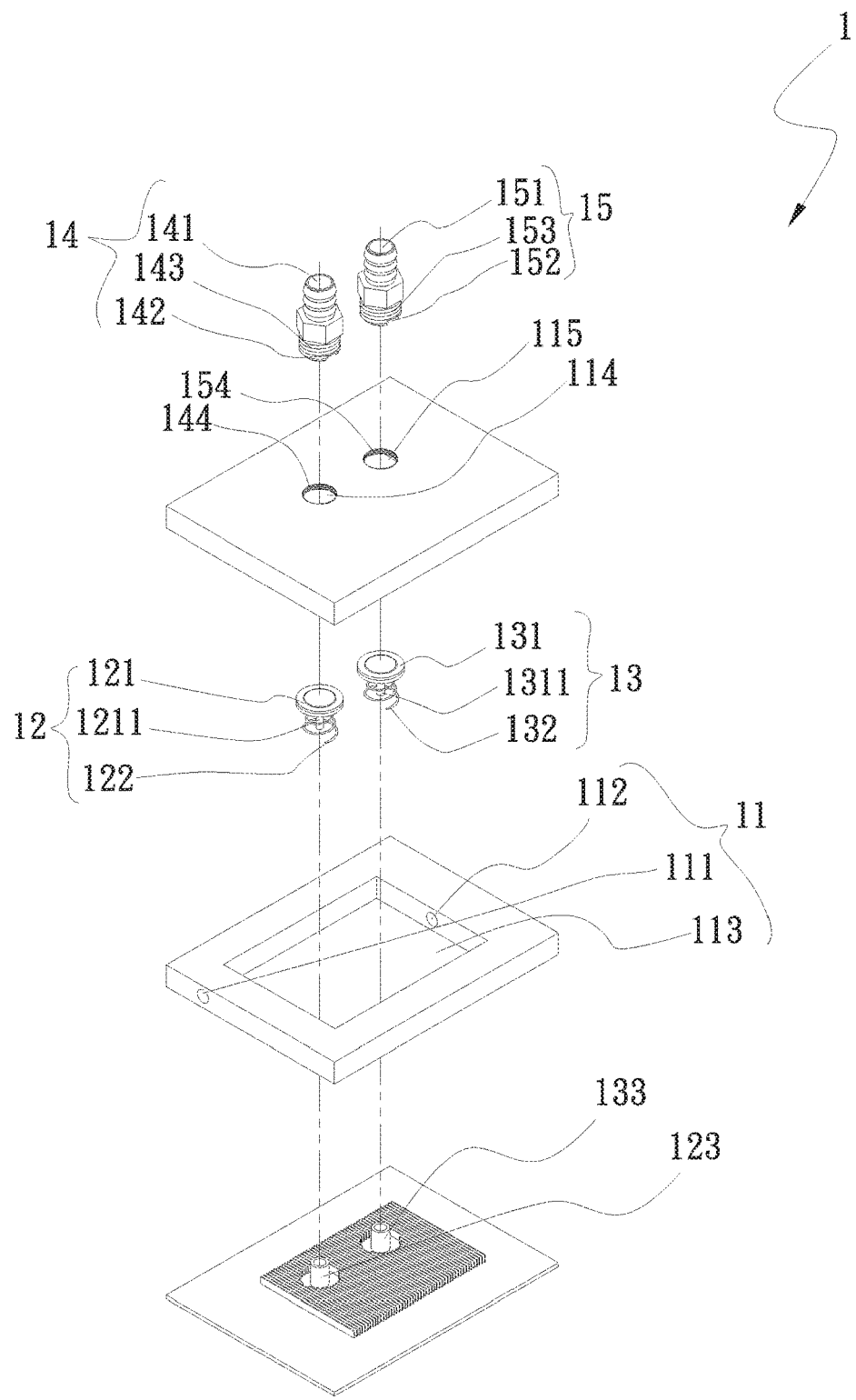
FIG. 1 is an exploded perspective view of a water-replenishing and gas-removing structure for water cooling device according to a first embodiment of the present invention.

The present invention will now be described with some preferred embodiments thereof and by referring to the accompanying drawings. For the purpose of easy to understand, elements that are the same in the preferred embodiments are denoted by the same reference numerals.

Figure 2:
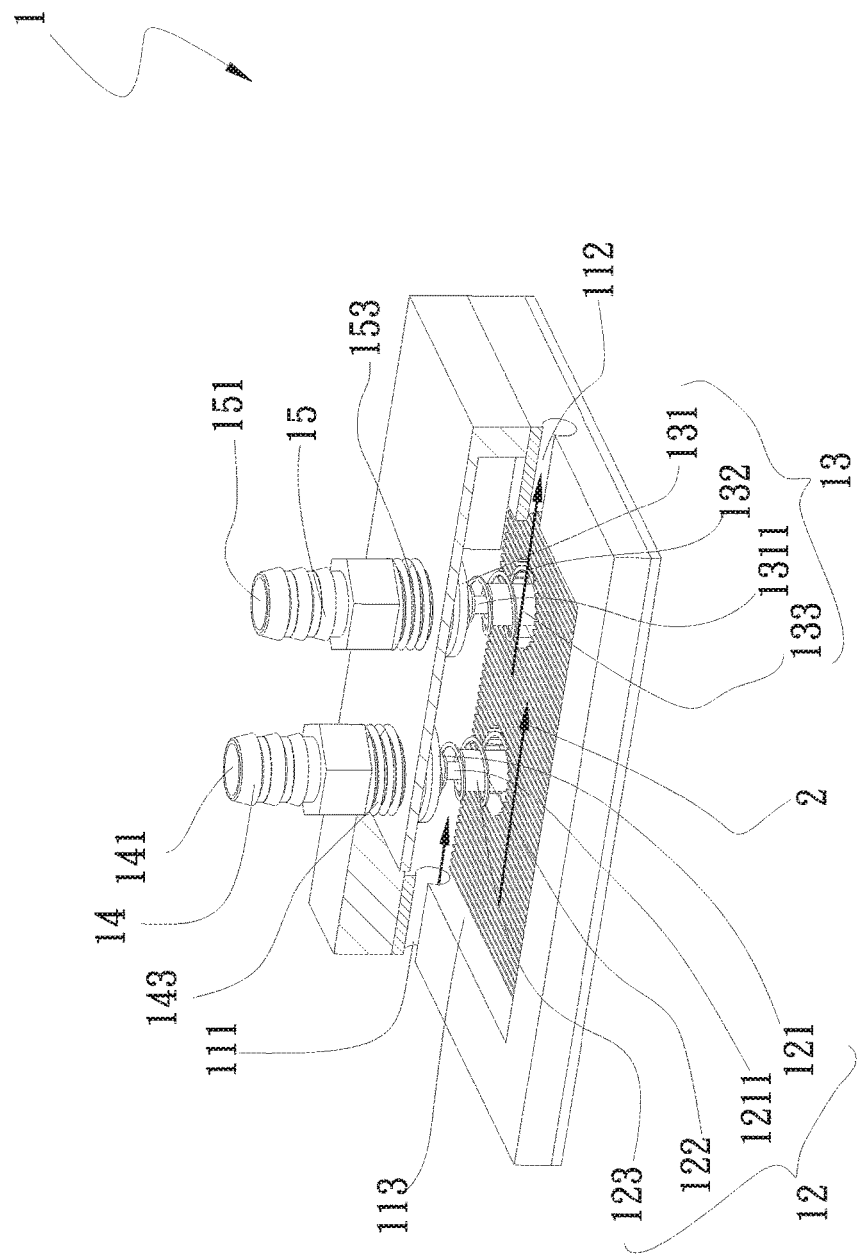
FIG. 2 is a cutaway view of the water-replenishing and gas-removing structure for water cooling device according to the first embodiment of the present invention.
Figure 3:
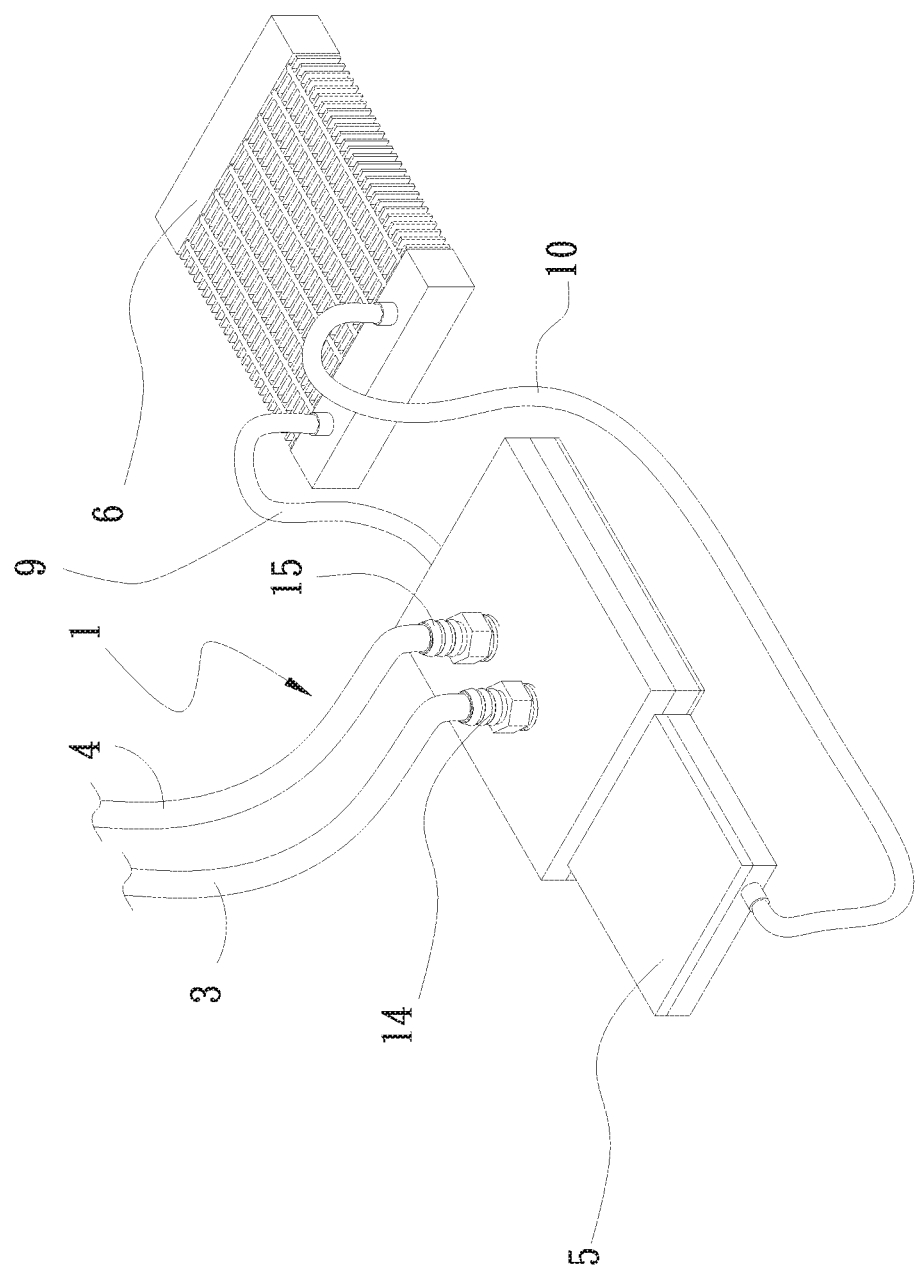
FIG. 3 shows the water-replenishing and gas-removing structure for water cooling device according to the first embodiment of the present invention in use.

Please refer to FIGS. 1 and 2, which are exploded perspective view and cutaway view, respectively, of a water-replenishing and gas-removing structure for water cooling device according to a first embodiment of the present invention; and to FIG. 3, which shows the water-replenishing and gas-removing structure for water cooling device of FIGS. 1 and 2 in use. For the purpose of clarity and conciseness, the water-replenishing and gas-removing structure for water cooling device according to the present invention is generally denoted by a reference numeral 1 and is herein briefly referred to as the water-replenishing and gas-removing structure 1. As shown, the water-replenishing and gas-removing structure 1 in the first embodiment includes a flow-guiding main body 11, a first valve member 12, a second valve member 13, a first connecting member 14, and a second connecting member 15.

The flow-guiding main body 11 has at least an inlet 111, an outlet 112, a water-receiving space 113, a first opening 114 and a second opening 115. The inlet 111, the outlet 112, the first opening 114 and the second opening 115 are communicable with the water-receiving space 113. In the first embodiment, the flow-guiding main body 11 is a water block. A cooling fluid 2 flows into and leaves the water-receiving space 113 via the inlet 111 and the outlet 112, respectively. The first and the second opening 114, 115 can be selectively formed on the flow-guiding main body 11 at any place thereof or at positions adjacent to the inlet 111 and the outlet 112, respectively.

The first valve member 12 is arranged in the water-receiving space 113 corresponding to the first opening 114 for opening or closing the first opening 114; and the second valve member 13 is arranged in the water-receiving space 113 corresponding to the second opening 115 for opening or closing the second opening 115. The first connecting member 14 is correspondingly connected to the first opening 114 and the second connecting member 15 is correspondingly connected to the second opening 115.

The first connecting member 14 has a first axial bore 141 axially extended through the first connecting member 14, and a first radial connecting slot 142 radially extended through the first connecting member 14 and formed on an end of the first connecting member 14 that is to be connected to the first opening 114. The first axial bore 141 and the first radial connecting slot 142 are communicable with each other.

The first valve member 12 is composed of a first body 121, a first elastic element 122 and a first valve seat 123. The first valve body 121 includes a first valve stem 1211, which is extended from one side of the first valve body 121 for movably inserting into the first valve seat 123. The first elastic element 122 is fitted around the first valve stem 1211 with two ends of the first elastic element 122 separately pressed against outer peripheral areas of the first valve body 121 and the first valve seat 123.

The second valve member 13 is composed of a second body 131, a second elastic element 132 and a second valve seat 133. The second valve body 131 includes a second valve stem 1311, which is extended from one side of the second valve body 131 for movably inserting into the second valve seat 133. The second elastic element 132 is fitted around the second valve stem 1311 with two ends of the second elastic element 132 separately pressed against outer peripheral areas of the second valve body 131 and the second valve seat 133.

The second connecting member 15 has a second axial bore 151 axially extended through the second connecting member 15, and a second radial connecting slot 152 radially extended through the second connecting member 15 and formed on an end of the second connecting member 15 that is to be connected to the second opening 115. The second axial bore 151 and the second radial connecting slot 152 are communicable with each other.

The first and the second connecting member 14, 15 are mainly used to connect the water-replenishing and gas-removing structure 1 to an external water-replenishing apparatus and an external gas-removing apparatus, respectively. When the first and the second connecting member 14, 15 are connected to the first and the second opening 114, 115, respectively, to communicate with the water-receiving space 113 of the flow-guiding main body 11, the first and the second connecting member 14, 15 push the first and the second valve member 12, 13 downward to thereby compress the first and the second elastic element 122, 132. When the first and the second elastic element 122, 132 are compressed to a certain degree, the first and the second valve member 12, 13 can no longer close the first and the second opening 114, 115, such that the first and the second opening 114, 115 are in an open state. At this point, the water-receiving space 113 not only communicates with the first and the second opening 114, 115, but also the first and the second axial bore 141, 151 as well as the first and the second radial slot 142, 152 of the first and the second connecting member 14, 15. Meanwhile, the first connecting member 14 is connected at another end, which is located opposite to the first opening 114, to a first pipe 3. The cooling fluid 2 is supplied via the first pipe 3 and the first connecting member 14 into the water-receiving space 113 of the flow-guiding main body 11. Also, the second connecting member 15 is connected at another end, which is located opposite to the second opening 115, to a second pipe 4. Surplus gas and surplus cooling fluid 2 in the water-receiving space 113 are guided out of the flow-guiding main body 11 via the second connecting member 15 and the second pipe 4.

The first and the second connecting member 14, 15 can be connected to the first and the second opening 114, 115 by way of screwing, tight-fitting or snap-fitting. In the illustrated first embodiment, the first and second connecting members 14, 15 are connected to the first and second openings 114, 115 by screwing. For this purpose, the first and the second connecting member 14, 15 are externally provided at the end to be connected to the first and the second opening 114, 115 with male threads 143, 153, respectively, and the first and the second opening 114, 115 are internally provided with females threads 144, 154, respectively. Therefore, the first and the second connecting member 14, 15 are connected to the first and the second opening 114, 115 through engagement of the male threads 143, 153 with the female threads 144, 154, respectively. However, it is understood the first embodiment is only illustrative, and in other operable embodiments, the first and second connecting members 14, 15 can be connected to the first and second openings 114, 115 in other manners.

As can be seen in FIG. 3, the inlet 111 and the outlet 112 of the flow-guiding main body 11 are connected to a pump 5, and are further connected to a water-cooling radiator 6 via a third pipe 9 and a fourth pipe 10, respectively. The pump 5 drives the cooling fluid 2 to circulate through the water-replenishing and gas-removing structure 1 and the water-cooling radiator 6, and the water-cooling radiator 6 is mainly used to cool the cooling fluid 2 that has absorbed heat. When the water-replenishing and gas-removing structure 1 according to the first embodiment of the present invention is used with the above-described cooling circulation structure, water-replenishing and gas-removing operations can be performed via the first/second openings 114, 115, the first/second valve members 12, 13, and the first/second connecting members 14, 15, respectively.

Figure 4:
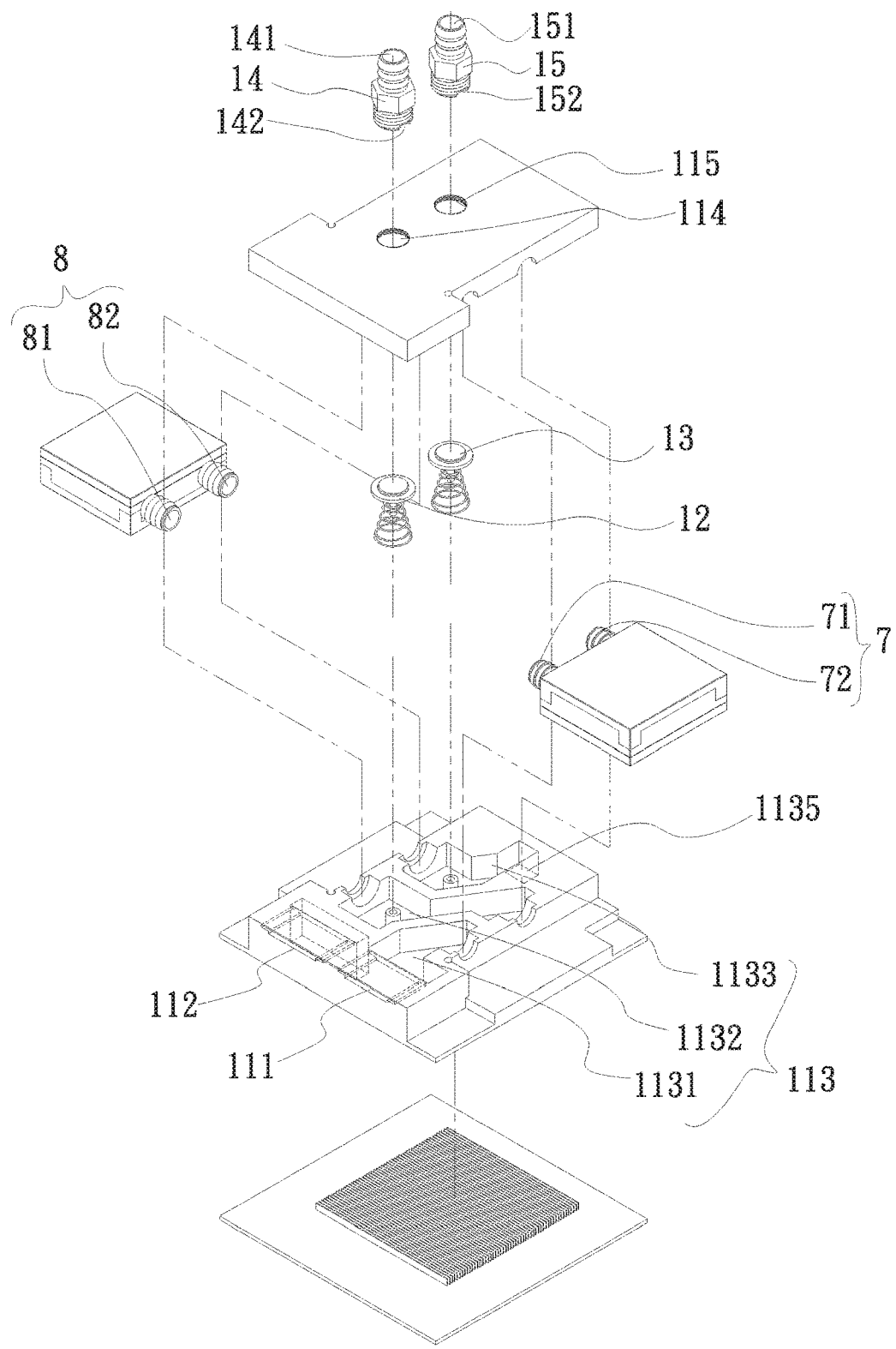
FIG. 4 is an exploded perspective view of a water-replenishing and gas-removing structure for water cooling device according to a second embodiment of the present invention.
Figure 5:
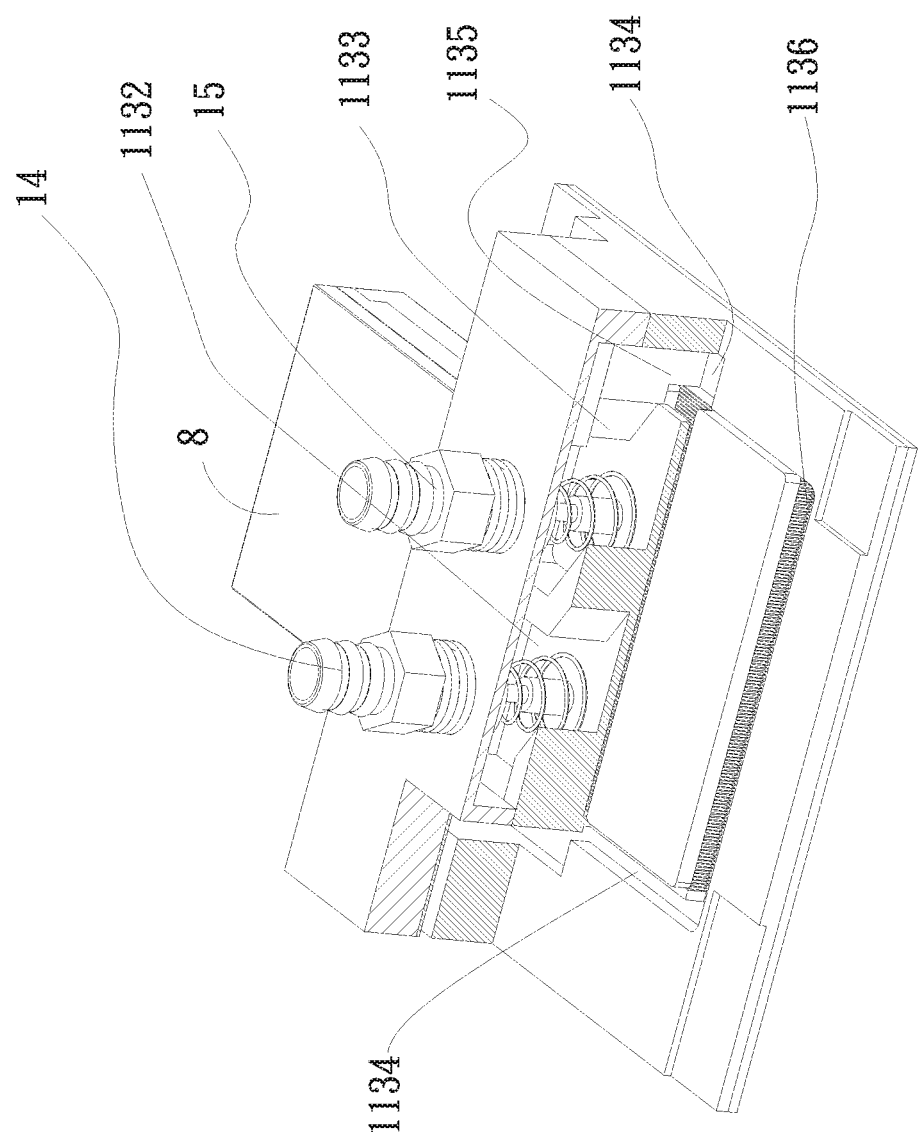
FIG. 5 is a cutaway view of the water-replenishing and gas-removing structure for water cooling device according to the second embodiment of the present invention.
Figure 6:
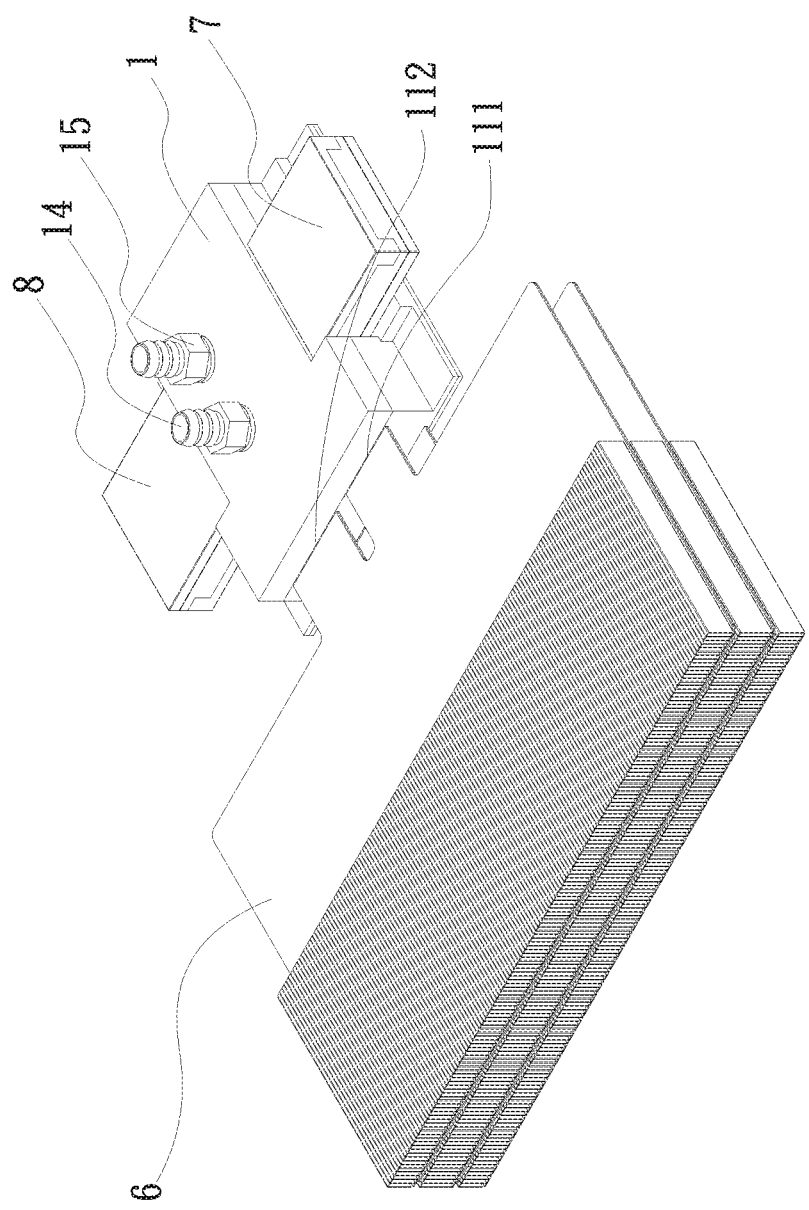
FIG. 6 shows the water-replenishing and gas-removing structure for water cooling device according to the second embodiment of the present invention in use.

Please refer to FIGS. 4 and 5, which are exploded perspective view and cutaway view, respectively, of a water-replenishing and gas-removing structure 1 according to a second embodiment of the present invention; and to FIG. 6, which shows the water-replenishing and gas-removing structure 1 of FIGS. 4 and 5 in use. As shown, the water-replenishing and gas-removing structure 1 in the second embodiment is partially structurally similar to the first embodiment. Therefore, all structural components of the second embodiment which are the same as those of the first embodiment are not repeatedly described herein. The second embodiment is different from the first embodiment in having a flow-guiding main body 11, of which the water-receiving space 113 is internally provided with a first chamber 1131, a second chamber 1132, a third chamber 1133, a heat-exchange chamber 1134, and a communicating opening 1135. The inlet 111 communicates with the first chamber 1131, the third chamber 1133 communicates with the heat-exchange chamber 1134 via the communicating opening 1135, and the outlet 112 communicates with another side of the heat-exchange chamber 1134 opposite to the communicating opening 1135. Further, in the second embodiment, the flow-guiding main body 11 has a first pump 7 and a second pump 8 connected thereto. The first pump 7 has a first inlet 71 and a first outlet 72; and the second pump 8 has a second inlet 81 and a second outlet 82. The first inlet 71 communicates with the first chamber 1131; the second chamber 1132 communicates with the first outlet 72 and the second inlet 81; and the third chamber 1133 communicates with the second outlet 82 and the communicating opening 1135. Moreover, in the second embodiment, the heat-exchange chamber 1134 is internally provided with a heat-exchange interface 1136.

In the second embodiment, the first opening 114 communicates with the second chamber 1132 and the first valve member 12 is correspondingly arranged in the second chamber 1132; the second opening 115 communicates with the third chamber 1133 and the second valve member 13 is correspondingly arranged in the third chamber 1133; and the inlet 111 and the outlet 112 are connected to a water-cooling radiator 6.

According to the present invention, it is not necessary to particularly limit which of the first and the second opening 114, 115 should be used to replenish cooling fluid or remove surplus gas; and the first and second openings 114, 115 as well as the first and second valve members 12, 13 can be correspondingly arranged on the flow-guiding main body 11 at any suitable positions.

With the water-replenishing and gas-removing structure provided by the present invention, cooling fluid can be replenished into and surplus gas can be removed from a water cooling device without the need of disassembling or reworking the water cooling device, enabling the water cooling device to have largely prolonged service life and increased working efficiency.

The present invention has been described with some preferred embodiments thereof and it is understood that many changes and modifications in the described embodiments can be carried out without departing from the scope and the spirit of the invention that is intended to be limited only by the appended claims.

What is claimed is:

1. A water-replenishing and gas-removing structure for water cooling device, comprising:

a flow-guiding main body having at least an inlet, an outlet, a water-receiving space, a first opening and a second opening; and the inlet, the outlet, the first opening and the second opening being communicable with the water-receiving space, the water-receiving space being internally provided with a first chamber, a second chamber, a third chamber, a heat-exchange chamber, a communicating opening, a first pump, and a second pump; the inlet communicating with the first chamber, and the third chamber communicating with the heat-exchange chamber via the communicating opening, the first pump having a first inlet and a first outlet, and the second pump having a second inlet and a second outlet, the first inlet communicating with the first chamber, the second chamber communicating with the first outlet and the second inlet, the third chamber communicating with the second inlet;

a first valve member being arranged in the water-receiving space of the flow-guiding main body corresponding to the first opening for opening or closing the first opening;

a second valve member being arranged in the water-receiving space of the flow-guiding main body corresponding to the second opening for opening or closing the second opening;

a first connecting member being correspondingly connected to the first opening and disposed outside the flow-guiding main body, wherein the first connecting member is connected at another end, which is located opposite to the first opening, to a first pipe, and a cooling fluid being supplied via the first pipe and the first connecting member into the water-receiving space of the flow-guiding main body; and a second connecting member being correspondingly connected to the second opening and disposed outside the flow-guiding main body, wherein the second connecting member is connected to another end, which is located opposite to the second opening, to a second pipe, and surplus gas and surplus cooling fluid in the water-receiving space being guided out of the flow-guiding main body via the second connecting member and the second pipe.

2. The water-replenishing and gas-removing structure as claimed in claim 1, wherein the first connecting member has a first axial bore axially extended through the first connecting member, and a first radial connecting slot radially extended through the first connecting member and formed on an end of the first connecting member that is to be connected to the first opening; and the first axial bore and the first radial connecting slot being communicable with each other.

3. The water-replenishing and gas-removing structure as claimed in claim 1, wherein the second connecting member has a second axial bore axially extended through the second connecting member, and a second radial connecting slot radially extended through the second connecting member and formed on an end of the second connecting member that is to be connected to the second opening;

and the second axial bore and the second radial connecting slot being communicable with each other.

4. The water-replenishing and gas-removing structure as claimed in claim 1, wherein the first valve member is composed of a first body, a first elastic element and a first valve seat; the first valve body including a first valve stem, which is extended from one side of the first valve body for movably inserting into the first valve seat; the first elastic element being fitted around the first valve stem with two ends of the first elastic element separately pressed against outer peripheral areas of the first valve body and the first valve seat.

5. The water-replenishing and gas-removing structure as claimed in claim 1, wherein the second valve member is composed of a second body, a second elastic element and a second valve seat; the second valve body including a second valve stem, which is extended from one side of the second valve body for movably inserting into the second valve seat; the second elastic element being fitted around the second valve stem with two ends of the second elastic element separately pressed against outer peripheral areas of the second valve body and the second valve seat.

6. The water-replenishing and gas-removing structure as claimed in claim 1, wherein the first and the second connecting member are connected to the first and the second opening, respectively, in a manner selected from the group consisting of screwing, tight-fitting and snap-fitting.

7. The water-replenishing and gas-removing structure as claimed in claim 6, wherein the first and the second connecting member have male threads externally provided at the end to be connected to the first and the second opening, respectively; and the first and the second opening have female threads provided therein.

8. The water-replenishing and gas-removing structure as claimed in claim 1, wherein the inlet and the outlet of the flow-guiding main body are connected to a pump, and are further connected to a water-cooling radiator via a third pipe and a fourth pipe, respectively; the pump driving a cooling fluid to circulate through the flow-guiding main body and the water-cooling radiator, and the water-cooling radiator being used to cool the cooling fluid that has absorbed heat.

9. A water-replenishing and gas-removing structure for water cooling device, comprising:

a flow-guiding main body having at least an inlet, an outlet, a water-receiving space, a first opening and a second opening, the inlet, the outlet, the first opening and the second opening being communicable with the water-receiving space, the water-receiving space being internally provided with a first chamber, a second chamber, a third chamber, a heat-exchange chamber, a communicating opening, a first pump, and a second pump, the inlet communicating with the first chamber, and the third chamber communicating with the heat-exchange chamber via the communicating opening, the first opening communicating with the second chamber, and the second opening communicating with the third chamber;

a first valve member being arranged in the second chamber of the water-receiving space of the flow-guiding main body corresponding to the first opening for opening or closing the first opening;

a second valve member being arranged in the third chamber of the water-receiving space of the flow-guiding main body corresponding to the second opening for opening or closing the second opening;

a first connecting member being correspondingly connected to the first opening and disposed outside the flow-guiding main body, wherein the first connecting member is connected at another end, which is located opposite to the first opening, to a first pipe, and a cooling fluid being supplied via the first pipe and the first connecting member into the water-receiving space of the flow-guiding main body; and a second connecting member being correspondingly connected to the second opening and disposed outside the flow-guiding main body, wherein the second connecting member is connected to another end, which is located opposite to the second opening, to a second pipe, and surplus gas and surplus cooling fluid in the water-receiving space being guided out of the flow-guiding main body via the second connecting member and the second pipe.

\* \* \* \* \*